(12) United States Patent
Jung et al.

(10) Patent No.: US 11,056,339 B1
(45) Date of Patent: Jul. 6, 2021

(54) THIN FILM ELECTRODE SEPARATION METHOD USING THERMAL EXPANSION COEFFICIENT

(71) Applicant: OSONG MEDICAL INNOVATION FOUNDATION, Cheongju-si (KR)

(72) Inventors: Ha-Chul Jung, Cheongju-si (KR); Young-Jin Kim, Cheongju-si (KR); Jin-Woo Ahn, Cheongju-si (KR); Seung-A Lee, Seoul (KR); Ha Na Park, Cheongju-si (KR)

(73) Assignee: OSONG MEDICAL INNOVATION FOUNDATION

( * ) Notice: Subject to any disclaimer, the term of this patent is extended or adjusted under 35 U.S.C. 154(b) by 0 days.

(21) Appl. No.: 16/756,100

(22) PCT Filed: Aug. 7, 2018

(86) PCT No.: PCT/KR2018/008921
§ 371 (c)(1),
(2) Date: Apr. 14, 2020

(87) PCT Pub. No.: WO2019/112141
PCT Pub. Date: Jun. 13, 2019

(30) Foreign Application Priority Data

Dec. 5, 2017 (KR) .......................... 10-2017-0165750

(51) Int. Cl.
*H01L 21/027* (2006.01)
*H01L 21/768* (2006.01)
*H01L 21/324* (2006.01)

(52) U.S. Cl.
CPC .......... *H01L 21/027* (2013.01); *H01L 21/324* (2013.01); *H01L 21/768* (2013.01)

(58) Field of Classification Search
CPC .... H01L 21/027; H01L 21/768; H01L 21/324
See application file for complete search history.

(56) References Cited

U.S. PATENT DOCUMENTS

2003/0175005 A1* 9/2003 Bauer .................. G02B 6/1203
385/145
2014/0087090 A1 3/2014 Miyagawa et al.

FOREIGN PATENT DOCUMENTS

| JP | 2005228873 A | 8/2005 |
|---|---|---|
| KR | 10-2007-0067442 A | 6/2007 |
| KR | 10-2012-0011608 A | 2/2012 |

(Continued)

OTHER PUBLICATIONS

International search report dated Nov. 15, 2018.

*Primary Examiner* — Quoc D Hoang
(74) *Attorney, Agent, or Firm* — Leepi (57) ABSTRACT

In a thin film electrode separation method using thermal expansion coefficient, a first solution is coated on a substrate. The first solution coated on the substrate is hardened. The substrate is left in a predetermined time, to form a first thin film having a first thermal expansion coefficient on the substrate. A photoresist is coated on the substrate having the thin film formed thereon. The photoresist coated on the substrate is hardened, to form a photoresist film having a second thermal expansion coefficient. A metal and a passivation layer are formed on the photoresist film. The photoresist film is detached from the first thin film, using difference of a thermal expansion coefficient between the photoresist film and the first thin film.

7 Claims, 5 Drawing Sheets

(56) References Cited

FOREIGN PATENT DOCUMENTS

| KR | 10-2013-0034480 A | 4/2013 |
|---|---|---|
| KR | 10-2014-0027811 A | 3/2014 |
| KR | 10-142973281 B | 8/2014 |
| KR | 10-2015-0109169 A | 10/2015 |
| WO | 2016129545 A1 | 8/2016 |

* cited by examiner

THIN FILM ELECTRODE SEPARATION METHOD USING THERMAL EXPANSION COEFFICIENT

BACKGROUND

1. Field of Disclosure

The present disclosure of invention relates to a thin film electrode separation method using thermal expansion coefficient, and more specifically the present disclosure of invention relates to a thin film electrode separation method from a substrate using difference of thermal expansion coefficient between temporary polyimide (TPI) with a photoresist.

2. Description of Related Technology

In manufacturing a semiconductor apparatus using a conventional semiconductor substrate, a detaching process in which a photoresist coated on a surface of the semiconductor substrate is detached from the surface of the semiconductor substrate is performed.

For example, as disclosed in Koran laid-open patent No. 10-2013-0034480, an etching process is used for detaching the photoresist from the surface of the substrate. Here, in the etching process, the photoresist is coated on the substrate to form a film, the photoresist is exposed and patterned via a lithographic process, and then the substrate is removed via a wet or dry etching process. However, the above mentioned etching process has low economic efficiency and the photoresist film may be damaged in the etching process.

Alternatively, as the conventional detaching process, an adhesive tape is provided between the photoresist film and the substrate, for the detaching. Here, the adhesive tape like kepton is attached on the substrate, the photoresist is coated on the substrate to form a film, the photoresist is patterned via the lithographic process, and then the photoresist film is detached using the adhesive tape. However, a thickness of the photoresist film is about several μm or hundreds of μm, and thus the photoresist film may be easily damaged due to a physical force generated in the detaching using the adhesive tape.

Related prior arts are Korean laid-open Patent No. 10-2007-0067442, Korean laid-open Patent No. 10-2012-0011608, and Korean laid-open Patent No. 10-2013-0034480.

SUMMARY

The present invention is developed to solve the above-mentioned problems of the related arts. The present invention provides a thin film electrode separation method from a substrate more easily, using difference of thermal expansion coefficient between temporary polyimide (TPI) with a photoresist.

According to an example embodiment, in the method, a first solution is coated on a substrate. The first solution coated on the substrate is hardened. The substrate is left in a predetermined time, to form a first thin film having a first thermal expansion coefficient on the substrate. A photoresist is coated on the substrate having the thin film formed thereon. The photoresist coated on the substrate is hardened, to form a photoresist film having a second thermal expansion coefficient. A metal and a passivation layer are formed on the photoresist film. The photoresist film is detached from the first thin film, using difference of a thermal expansion coefficient between the photoresist film and the first thin film.

In an example, in coating the first solution on the substrate, the first solution may be coated on the substrate via a spin coating.

In an example, in hardening the first solution, the substrate on which the first solution is coated may be disposed over a hot plate, and a plurality of hardening processes with various kinds of temperatures and times may be performed.

In an example, in hardening the first solution, the substrate on which the first solution is coated, may be heated with a temperature of about 60° C. during about 30 mins. The substrate on which the first solution is coated, may be heated with a temperature of about 80° C. during about 30 mins. The substrate on which the first solution is coated, may be heated with a temperature of about 150° C. during about 30 mins. The substrate on which the first solution is coated, may be heated with a temperature of about 230° C. during about 30 mins. The substrate on which the first solution is coated, may be heated with a temperature of about 300° C. during about 30 mins.

In an example, the first solution may be a solution of temporary polyimide (TPI).

In an example, the first thermal expansion coefficient of the first thin film may be about 3, and the second thermal expansion coefficient of the photoresist film may be not less than about 50.

In an example, in detaching the photoresist film from the first thin film, a laser or a cutter may be used for forming a scratch at a side of the photoresist film, and then the photoresist film may be detached using a detaching device.

According to the present example embodiments, the TPI thin film and the photoresist film are easily detached from each other, using a thermal stress due to the difference of the thermal expansion coefficient, and thus the substrate and the TPI thin film may be less damaged and detached.

In addition, massive water resources and waste liquor treating processes are unnecessary to remove the photoresist film, and thus environmental pollution may be prevented.

In addition, additional processes for removing the photoresist film are unnecessary, and thus the entire processes are decreased and productivity may be increased.

DETAILED DESCRIPTION

The invention is described more fully hereinafter with Reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention is described more fully hereinafter with reference to the accompanying drawings, in which embodiments of the invention are shown.

Figure 1:
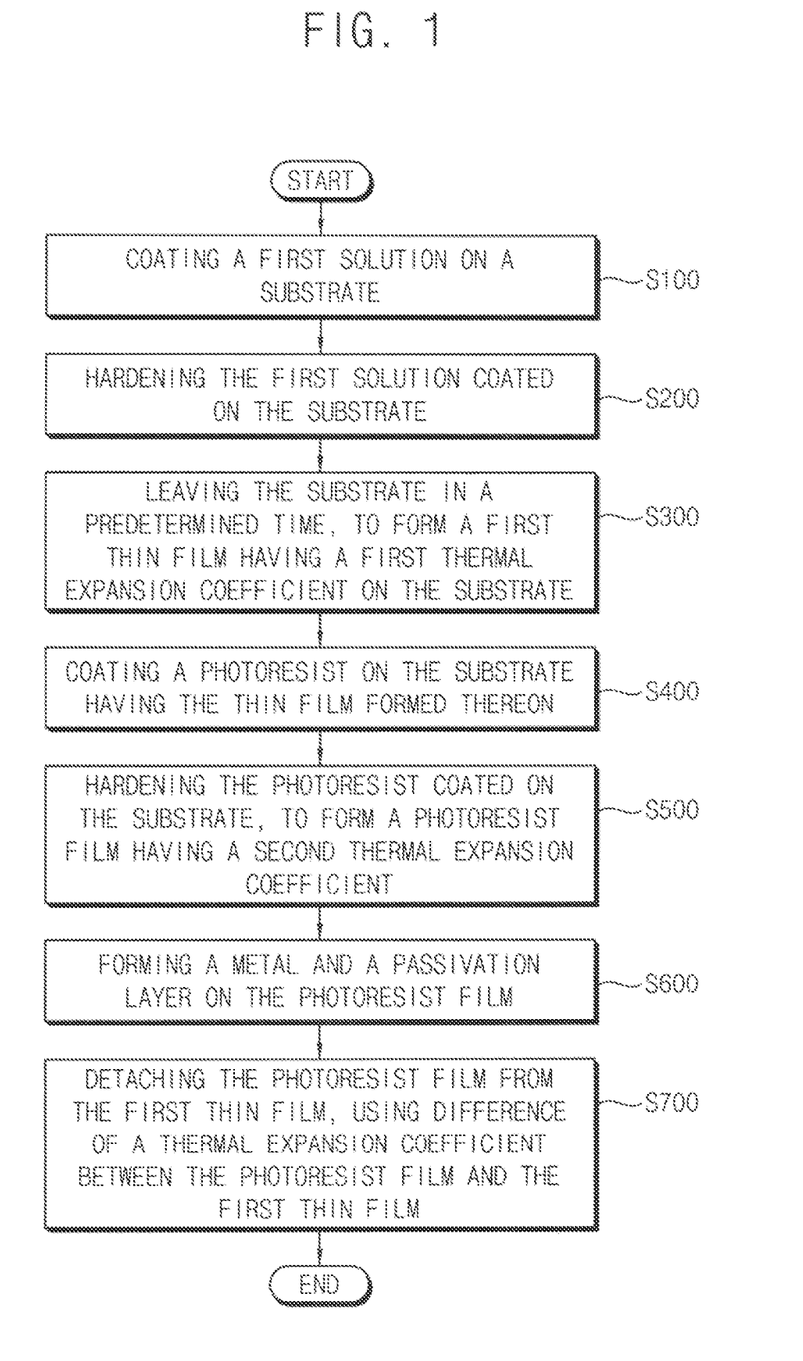
FIG. 1 is a flow chart showing a thin film electrode separation method using thermal expansion coefficient according to an example embodiment of the present invention.

FIG. 1 is a flow chart showing a thin film electrode separation method using thermal expansion coefficient according to an example embodiment of the present invention. FIG. 2A, FIG. 2B, FIG. 2C, FIG. 2D, FIG. 2E, FIG. 2F and FIG. 2G are process views illustrating the method of FIG. 1.

Although not shown in the figure, in the present example embodiment, a substrate 100 is cleaned with a tetramethyl ammonium hydroxide (TMAH), before the first solution 10 is coated. For example, the first solution 10 may be a temporary polyimide (TPI) solution, and the TPI solution has relatively very lower viscosity and thus a coating thickness is relatively very thinner. Thus, the substrate 100 should be cleaned before the coating, for coating with TPI solution more efficiently.

The TPI solution used as the first solution in the present example embodiment, is a low viscosity liquid material having a relatively lower thermal expansion coefficient, different from polyimide (PI) conventionally used in the semiconductor process. In addition, the TPI solution is chemically stably, and when hardened, the TPI solution may be very flexible.

Figure 2A:
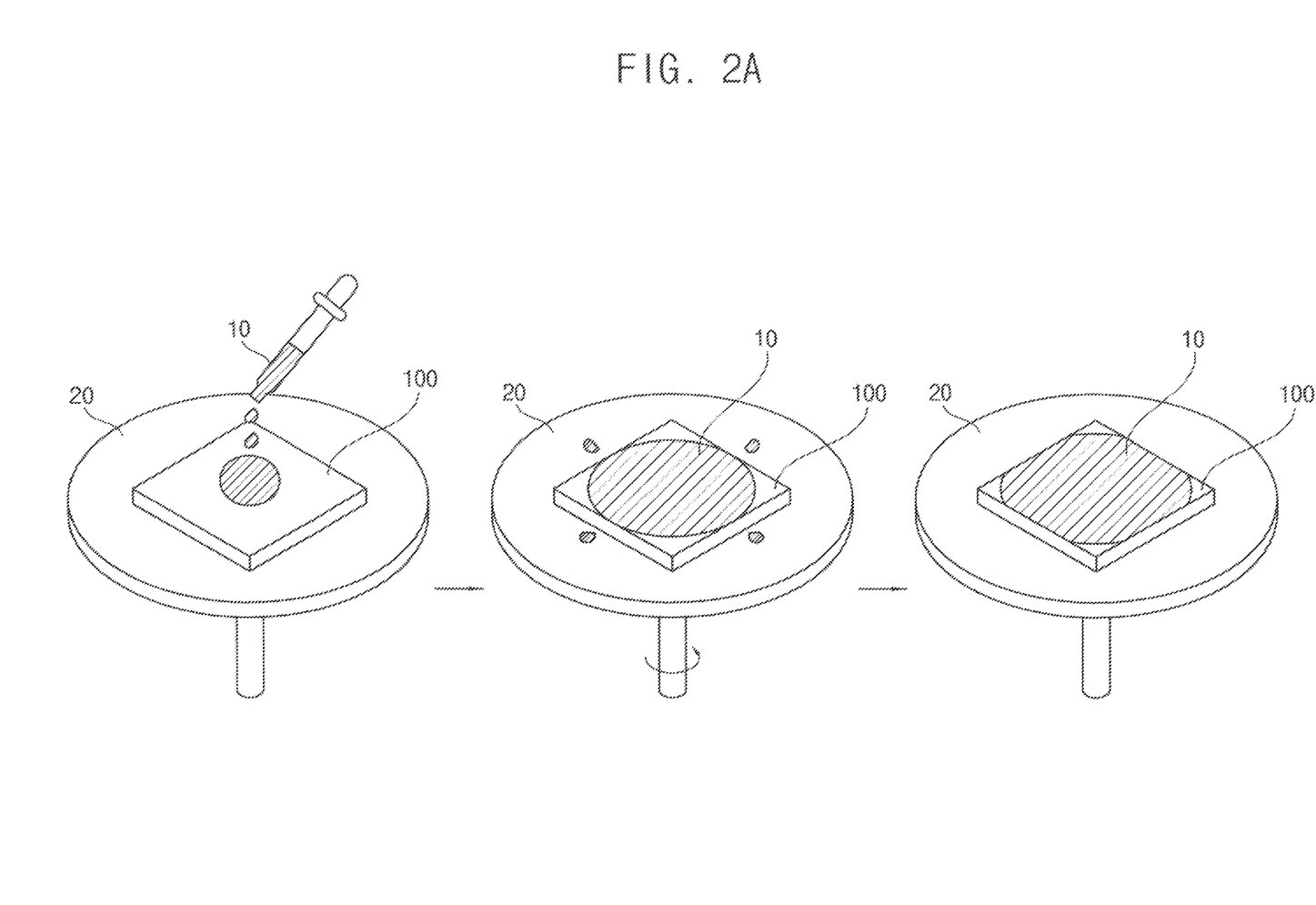
FIG. 2A, FIG. 2B, FIG. 2C, FIG. 2D, FIG. 2E, FIG. 2F and FIG. 2G are process views illustrating the method of FIG. 1.

Then, referring to FIG. 1 and FIG. 2A, the first solution 10 is coated on the substrate 100 (step S100).

The substrate 100 may be one selected from the group consisting of silicon, glass, quartz, metal and plastic.

The first solution 10 is coated on the substrate 100 via a spin coating process. Here, the first solution 10 is coated on the substrate 100 using a spin coater 20, and the spin coating process is performed with about 1000 rpm and in about 30 seconds.

Figure 2B:
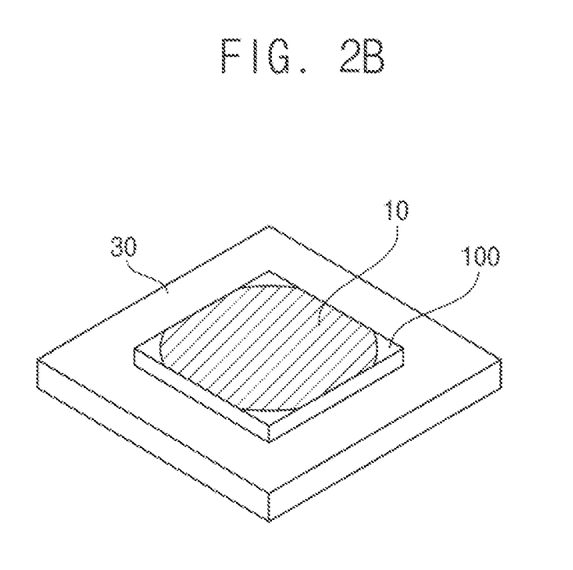

Then, referring to FIG. 1 and FIG. 2B, the first solution 10 coated on the substrate 100 is hardened step by step (step S200).

Here, the substrate 100 on which the first solution 10 is coated is disposed over a hot plate 30, and then is heated step by step. The heating is performed step by step with different temperature and time conditions, not with a single fixed condition of temperature and time.

For example, using the hot plate 30, the heating may be performed with a temperature of about 60° C. during about 30 minutes, then the heating may be performed with a temperature of about 80° C. during about 30 minutes, then the heating may be performed with a temperature of about 150° C. during about 30 minutes, then the heating may be performed with a temperature of about 230° C. during about 30 minutes, and then the heating may be performed with a temperature of about 300° C. during about 30 minutes.

Figure 2C:
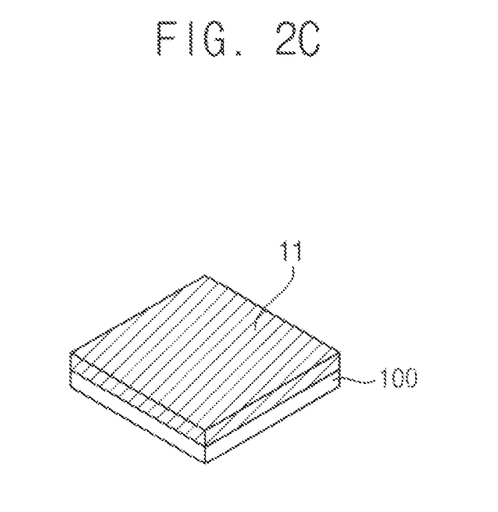

Accordingly, after the above mentioned step by step hardening, referring to FIG. 1 and FIG. 2C, the substrate 100 is left with a predetermined time, to form a first thin film 11 on the substrate 100 (step S300).

Here, the first thin film 11 has a first thermal expansion coefficient which may be about 3. Considering a thermal expansion coefficient of conventional polyimide (PI) is between about 19 and about 40, the first thin film 11 which is a TPI thin film, may have the thermal expansion coefficient much lower than that of the conventional PI.

Figure 2D:
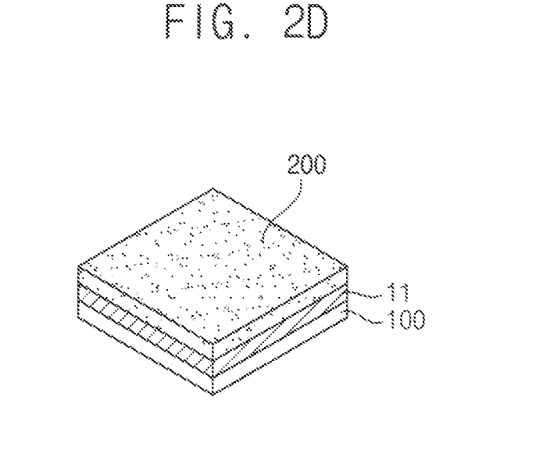

After the thin film 11 is formed on the substrate 100, referring to FIG. 1 and FIG. 2D, a photoresist 200 is coated on the substrate 100 (step S400).

Here, the first thin film 11 is formed on the substrate 100, and thus the photoresist 200 is substantially coated on the first thin film 11.

In addition, the photoresist 200 may be formed as a photoresist film which is detached from the substrate, as mentioned below, and thus may be a base of an electrode.

Figure 2E:
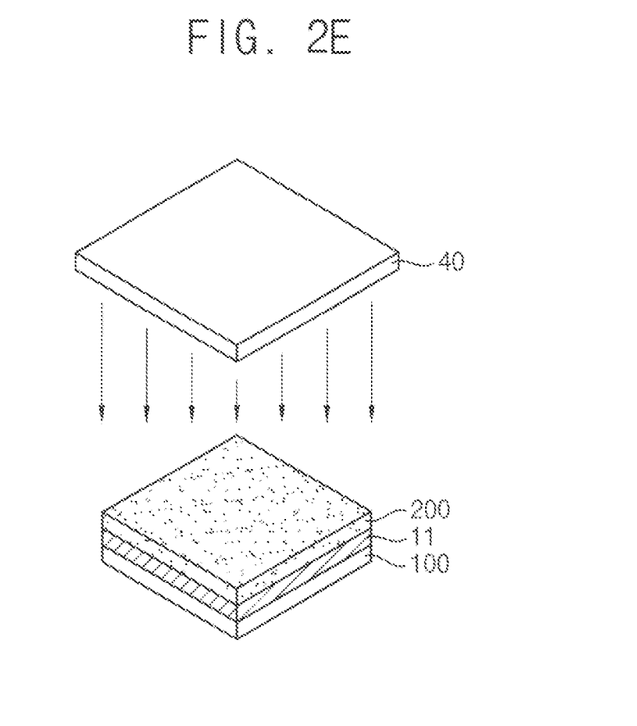

Then, referring to FIG. 1 and FIG. 2E, the photoresist coated on the substrate 100 is hardened, to form a photoresist film (step S500). Here, only heat may be provided to the substrate 100 via a heat irradiator 40, or heat and UV may be provided or irradiated to the substrate at the same time, for the hardening.

The photoresist film 201 has a second thermal expansion coefficient, and the second thermal expansion coefficient may be not less than about 50.

Thus, the photoresist film 201 has the thermal expansion coefficient different from that of the first thin film 11, and the difference of the thermal expansion coefficient between the photoresist film 201 and the first thin film 11 is relatively large.

Figure 2F:
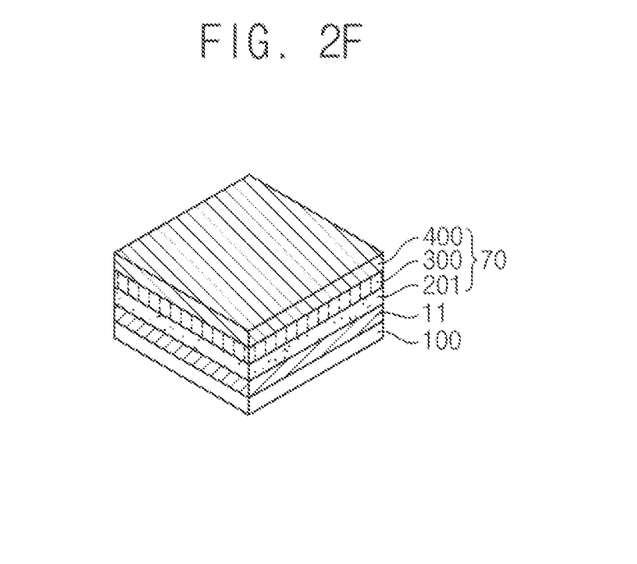

Then, referring to FIG. 1 and FIG. 2F, a metal 300 and a passivation layer 400 are sequentially formed on the photoresist film 201. The metal 300 and the passivation layer 400 are sequentially formed on the photoresist film 201, to complete an electrode 70. Thus, the electrode 70 includes the photoresist film 201, the metal 300 and the passivation layer 400.

Here, the metal 300 may include at least one of nickel (Ni), palladium (Pd), cobalt (Co), tungsten (W), titanium (Ti), and so on, but not limited thereto.

In addition, the passivation layer 400 may include at least one of a metal oxide, a carbon nanotube, a polymer electrolyte, a glass fiber and so on, but not limited thereto. The metal oxide may be a wire, tube, or particle type metal oxide (for example, Al2O3 or silicon oxide), and may be a silver nanowire, a copper mesh, a silver mesh, a silver salt and so on. The above mentioned material may be used only or at least two materials may be used together.

As illustrated in the figure, each of the metal 300 and the passivation layer 400 has a rectangular plate shape, but the shape of the metal 300 and the passivation layer 400 may be variously changed, and not limited thereto as illustrated in the figure.

Figure 2G:
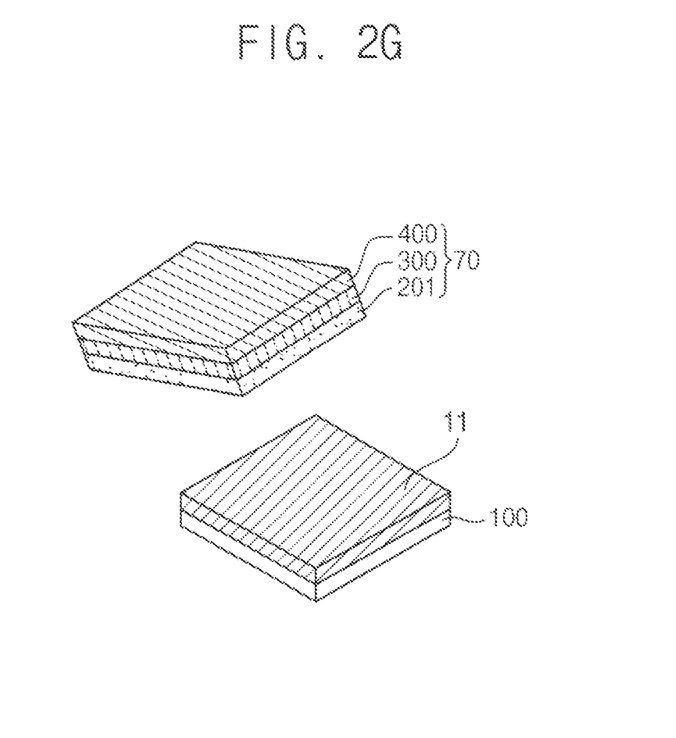

Then, referring to FIG. 1 and FIG. 2G, to detach the electrode 70 from the substrate 100, the photoresist film 201 is detached from the first thin film 11 (step S700). Here, the difference of the thermal expansion coefficient between the photoresist film 201 and the firs thin film 11 is important.

As mentioned above, the thermal expansion coefficient of the first thin film 11 is about 3, and that of the photoresist film 201 is not less than about 50. Thus, the thermal expansion coefficient of the first thin film 11 is different from that of the photoresist film 201, and the difference between the thermal expansion coefficient of the first thin film 11 and that of the photoresist film 201 is relatively large.

The above difference of the thermal expansion coefficient causes a thermal stress, and thus a thermal stress may be caused between the first thin film 11 and the photoresist film 201.

Accordingly, due to the thermal stress caused by the difference of the thermal expansion coefficient, an interfacial adhesion between the first thin film 11 and the photoresist film 201 is weakened, and thus the first thin film 11 and the photoresist film 201 may be detached more easily.

Here, as the thermal stress increases more than the interfacial adhesion, the first thin film 11 and the photoresist film 201 are detached from each other. As the thermal stress due to the difference of the thermal expansion coefficient increases, the adhesion between the firs thin film 11 and the photoresist film 201 is rapidly weakened, and thus the first thin film 11 and the photoresist film 201 are ready to be physically separated.

For the detaching of the first thin film 11 and the photoresist film 201, a laser or a cutter may be used.

The laser is irradiated or the cutter is inserted into a side of an interfacial surface between the first thin film 11 and the photoresist film 201, and thus the side thereof is firstly exfoliated. Then, a detaching device such as pincettes or forceps, is used to detach the exfoliated side first, and then the photoresist film 201 is entirely detached from the first thin film 11.

Accordingly, the physical exfoliation is caused between the interfacial surface between the first thin film 11 and the photoresist film 201, using the laser or the cutter, and thus a conventional chemical detaching process may be omitted. Thus, the electrode 70 may be less damaged, and the detaching process may be performed more easily.

After the photoresist film 201 is detached from the first thin film 11, the electrode 70 on the photoresist fil 201 is detached from the first thin film 11, and thus the electrode 70 is completely manufactured.

Accordingly, the electrode is formed on the photoresist film 201, and thus the electrode may be used more efficiently and easily to manufacture a flexible device such as a stretchable device, a wearable device and so on. In manufacturing the flexible device, when the electrode is directly formed on a flexible substrate, a processing error in forming the electrode increases, and thus a relatively hard substrate is used for forming the electrode on the substrate and the hard substrate is removed. Thus, in the method of the present example embodiment, when removing the hard substrate, the detaching the electrode from the hard substrate may be performed more easily and the electrode is less damaged.

According to the present example embodiments, the TPI thin film and the photoresist film are easily detached from each other, using a thermal stress due to the difference of the thermal expansion coefficient, and thus the substrate and the TPI thin film may be less damaged and detached.

In addition, massive water resources and waste liquor treating processes are unnecessary to remove the photoresist film, and thus environmental pollution may be prevented.

In addition, additional processes for removing the photoresist film are unnecessary, and thus the entire processes are decreased and productivity may be increased.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

| <Reference numerals> | |
|---|---|
| 10: first solution | 11: first thin film |
| 20: spin coater | 30: hot plate |
| 40: heat irradiator | 70: electrode |
| 100: substrate | |
| 200: photoresist | 201: photoresist film |
| 300: metal | 400: passivation layer |

What is claimed is:

1. A thin film electrode separation method comprising:
coating a first solution on a substrate;
hardening the first solution coated on the substrate;
leaving the substrate in a predetermined time, to form a first thin film having a first thermal expansion coefficient on the substrate;
coating a photoresist on the substrate having the thin film formed thereon;
hardening the photoresist coated on the substrate, to form a photoresist film having a second thermal expansion coefficient;
forming a metal and a passivation layer on the photoresist film; and
detaching the photoresist film from the first thin film, using difference of a thermal expansion coefficient between the photoresist film and the first thin film.

2. The method of claim 1, wherein in coating the first solution on the substrate,
the first solution is coated on the substrate via a spin coating.

3. The method of claim 1, wherein in hardening the first solution,
the substrate on which the first solution is coated is disposed over a hot plate, and a plurality of hardening processes with various kinds of temperatures and times is performed.

4. The method of claim 3, wherein in hardening the first solution,
- heating the substrate on which the first solution is coated, with a temperature of about 60° C. during about 30 mins;
- heating the substrate on which the first solution is coated, with a temperature of about 80° C. during about 30 mins;
- heating the substrate on which the first solution is coated, with a temperature of about 150° C. during about 30 mins;
- heating the substrate on which the first solution is coated, with a temperature of about 230° C. during about 30 mins; and
- heating the substrate on which the first solution is coated, with a temperature of about 300° C. during about 30 mins.

5. The method of claim 1, wherein the first solution is a solution of temporary polyimide (TPI).

6. The method of claim 5, wherein the first thermal expansion coefficient of the first thin film is about 3, and the second thermal expansion coefficient of the photoresist film is not less than about 50.

7. The method of claim 1, wherein in detaching the photoresist film from the first thin film,
- a laser or a cutter is used for forming a scratch at a side of the photoresist film, and then the photoresist film is detached using a detaching device.

* * * * *